United States Patent
Shintaku

(10) Patent No.: US 7,768,004 B2
(45) Date of Patent: Aug. 3, 2010

(54) SEMICONDUCTOR DEVICE INCLUDING CHIPS WITH ELECTRICALLY-ISOLATED TEST ELEMENTS AND ITS MANUFACTURING METHOD

(75) Inventor: Hideomi Shintaku, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 631 days.

(21) Appl. No.: 11/255,885

(22) Filed: Oct. 24, 2005

(65) Prior Publication Data
US 2006/0087336 A1    Apr. 27, 2006

(30) Foreign Application Priority Data
Oct. 25, 2004    (JP) .............................. 2004-309013

(51) Int. Cl.
*H01L 23/58* (2006.01)
(52) U.S. Cl. .................. 257/48; 257/538; 257/539; 257/577; 257/700; 257/750; 257/758; 257/503; 257/E23.011; 257/E27.021; 257/763; 438/14; 324/763

(58) Field of Classification Search .................. 257/538, 257/539, 577, 750, 758, 503, 700, E23.011, 257/E21.004, E27.021, 48, 508, 760, 776; 324/763; 438/14
See application file for complete search history.

(56) References Cited

U.S. PATENT DOCUMENTS 6,822,330 B2 * 11/2004 Park et al. .................... 257/758
2003/0006795 A1 * 1/2003 Asayama et al. ............. 324/763
2004/0207057 A1 * 10/2004 Matsubara .................. 257/678

FOREIGN PATENT DOCUMENTS
JP        9-321104        12/1997
JP        2002-313864     10/2002

* cited by examiner

*Primary Examiner*—Lynne A Gurley
*Assistant Examiner*—Meiya Li
(74) *Attorney, Agent, or Firm*—McGinn IP Law Group, PLLC

(57) ABSTRACT

In a semiconductor device including a semiconductor substrate and an electrode pad formed over the semiconductor substrate, at least one of test element is formed in a region of the semiconductor substrate beneath the electrode pad. The test element is electrically isolated from upper conductive layers outside of the region and the electrode pad.

10 Claims, 17 Drawing Sheets

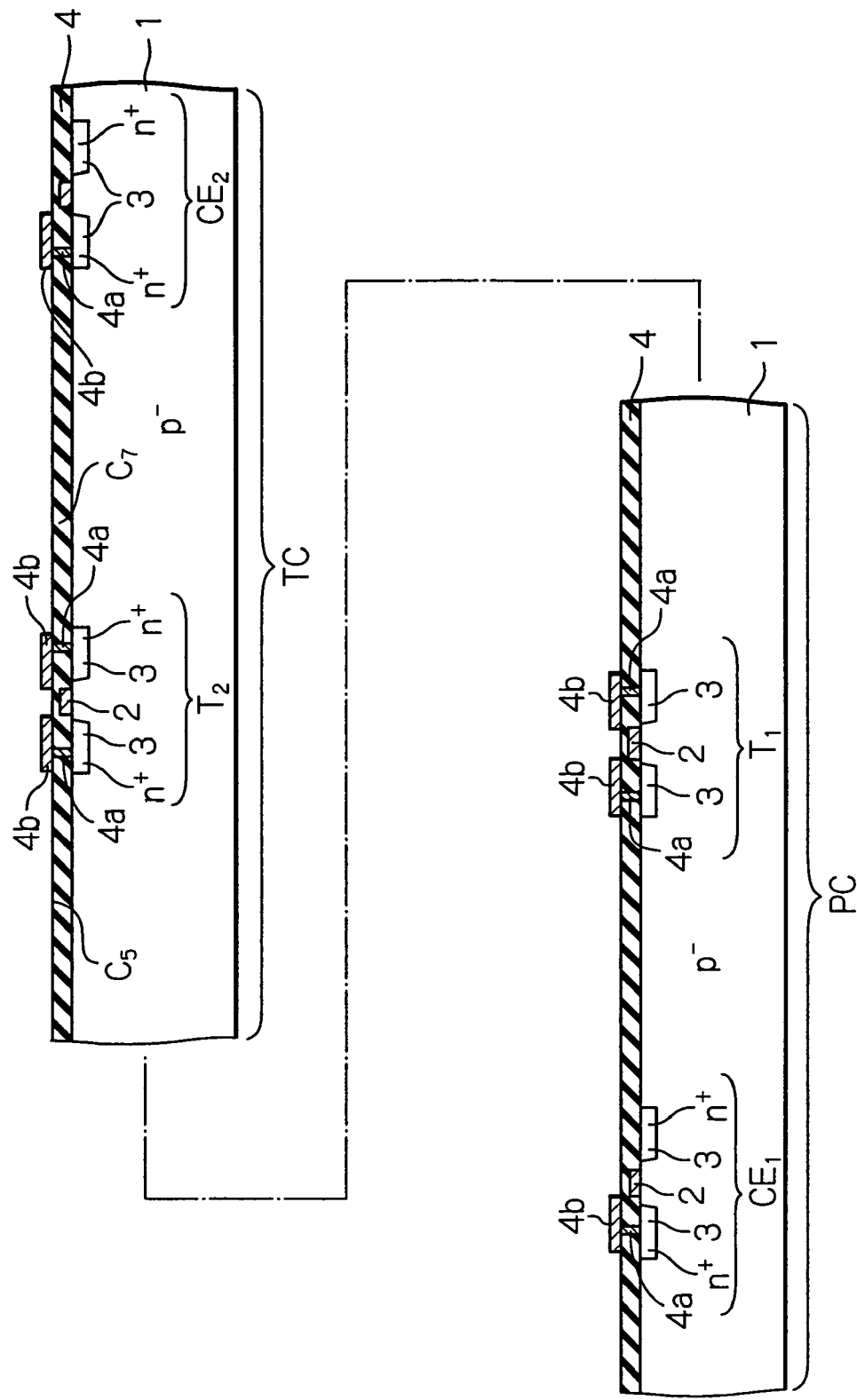

SEMICONDUCTOR DEVICE INCLUDING CHIPS WITH ELECTRICALLY-ISOLATED TEST ELEMENTS AND ITS MANUFACTURING METHOD

BACKGROUND OF THE INVENTION

1. Field of the Invention

The present invention relates to a semiconductor device including test element group (TEG) elements and its manufacturing method.

2. Description of the Related Art

Generally, in a method for manufacturing a semiconductor device (wafer), TEG elements are formed in the semiconductor device, so that the electrical properties thereof can be evaluated by contacting probes to the TEG elements.

In a first prior art semiconductor device (wafer) (see: JP-2002-313864-A), a semiconductor wafer is divided into product chip areas. Also, TEG elements are formed beneath electrode pads in each of the product chip areas, while test electrode pads are formed in scribe line areas. The TEG elements are electrically connected to the test electrode pads. Therefore, the electrical properties of the semiconductor wafer can be evaluated by contacting probes to the test electrode pads.

In the above-described first prior art semiconductor device (wafer), since the TEG elements are covered by the electrode pads in the product chip areas, a third party including users cannot observe the TEG elements. In addition, after the semiconductor wafer is diced and assembled into chip packages, the test electrode pads in the scribe line areas are scrapped. Therefore, the electrical properties of the semiconductor wafer are never evaluated by a third party including users. Also, since the TEG elements and the test electrode pads do not require additional occupied areas, the integration of the product chips is not affected. Further, since the TEG elements and the test electrode pads are formed simultaneously by the manufacturing steps for the other portions of the product chip areas, the manufacturing cost hardly increases. Still further, since test chip areas for only TEG elements are not included in the semiconductor wafer, the manufacturing steps are not so complex, which also would not increase the manufacturing cost.

In the above-described first semiconductor wafer, however, after the semiconductor wafer is diced and assembled into chip packages, it is impossible for the manufacturer per se to evaluate the electrical properties of the semiconductor wafer. Note that, even after the semiconductor wafer is diced and assembled into the chip packages, the electrical properties of the chip packages are often required to be evaluated under various environments such as temperature environment and humidity environment.

In a second prior art semiconductor device (wafer) (see: JP-9-321104-A), a semiconductor wafer is also divided into product chip areas. Also, TEG elements are formed beneath main electrode pads in each of the product chip areas, and sub electrode pads (test electrode pads) are formed in each of the product chip areas. The TEG elements are electrically connected to the test electrode pads as well as the main electrode pads. Therefore, the electrical properties of the semiconductor wafer can be evaluated by contacting probes to the test electrode pads.

In the above-described second prior art semiconductor wafer, even after the semiconductor wafer is diced and assembled into chip packages, since the test electrode pads are not scrapped, the manufacturer per se can evaluate the electrical properties of the semiconductor wafer. Also, since the TEG elements and the test electrode pads are formed simultaneously by the manufacturing steps for the other portions of the product chips, the manufacturing cost hardly increases. Further, since test chip areas for only TEG elements are not provided in the semiconductor wafer, the manufacturing steps are not so complex, which also would not increase the manufacturing cost.

In the above-described second prior art semiconductor wafer, however, although the TEG elements are covered by the main electrode pads, even when the semiconductor wafer is diced and assembled into chip packages, the test electrode pads are not scrapped. Therefore, a third party including users can easily evaluate the electrical properties of the semiconductor wafer. Also, since the sub electrode pads (test electrode pads) are required in each of the product chip areas, the integration would be negatively affected. Further, bonding wire of the main electrode pads would be short-circuited to the sub electrode pads (test electrode pads).

In a third prior art semiconductor device (wafer), a semiconductor wafer is divided into product chip areas where TEG elements are not formed and test chip areas where various kinds of TEG elements and their test electrode pads are formed.

In the above-described third prior art semiconductor wafer, even after the semiconductor wafer is diced and assembled into chip packages, since test chip packages are obtained, the manufacturer per se can evaluate the electrical properties of the semiconductor wafer. Also, since the TEG elements are not included in the product chip areas, the electrical properties of the semiconductor wafer are never evaluated by a third party including users. Further, since the product chip areas do not require additional occupied areas, the integration of the product chips is not affected.

In the above-described third prior art semiconductor wafer, however, since the manufacturing steps for the product chip areas are different from those for the test chip areas, the manufacturing steps become complex, which would increase the manufacturing cost. Particularly, the result of the test chip areas by chemical mechanical polishing (CMP) steps and etching steps affects the product chip areas. As a result, the properties of the product chips would deteriorate.

SUMMARY OF THE INVENTION

It is an object of the present invention to provide a highly-integrated, inexpensive and non-complex semiconductor device where the manufacturer per se can evaluate the electrical properties of product chips while a third party including users cannot evaluate them even after the semiconductor device is diced and assembled into the semiconductor chips.

Another object is to provide a method for manufacturing such a semiconductor device.

According to the present invention, in a semiconductor device including a semiconductor substrate and an electrode pad-formed over the semiconductor substrate, at least one of test element is formed in a region of the semiconductor substrate beneath the electrode pad. The test element is electrically isolated from upper conductive layers outside of the region and the electrode pad. As a result, when the semiconductor device is diced and assembled into semiconductor chips, the manufacturer per se can evaluate the semiconductor device, while a third party including users cannot evaluate the semiconductor device due to the electrical disconnection between the test element and the electrode pad. In this case, since the test element is covered by the electrode pad, a third party cannot find the test element. Also, since the test element does not require additional occupied areas, the integration is not affected. Further, since the test element can be formed by the manufacturing steps for the other portions, the manufacturing cost hardly increases. Still further, since the structure can be the same as that of the test chips except for the electrical connection/disconnection between the test element and the electrode pads, the manufacturing steps would not be complex, which would not increase the manufacturing cost and also the properties would not deteriorate.

Also, at least one circuit element is formed in the above-mentioned region. In this case, the circuit element is electrically connected to one of the upper conductive layers and the electrode pad.

Further, in a method for manufacturing a semiconductor device divided into product chip areas, at least one circuit element and at least one test element are formed in each of the product chip areas. Then, a connection structure is formed in each of the product chip areas. Then, electrode pads are formed in each of the product chip areas. Finally, the product chip areas are diced and assembled into chip packages. In this case, the circuit element is electrically connected through the connection structure to some of the electrode pads, while the test element is formed beneath one of the electrode pads and electrically isolated from the electrode pads without being connected to the connection structure.

BRIEF DESCRIPTION OF THE DRAWINGS

The present invention will be more clearly understood from the description set forth below, with reference to the accompanying drawings, wherein:

FIGS. 4A, 4B and 4C are cross-sectional views for explaining a method for manufacturing the semiconductor wafer of FIG. 1;

DESCRIPTION OF THE PREFERRED EMBODIMENTS

Figure 1:
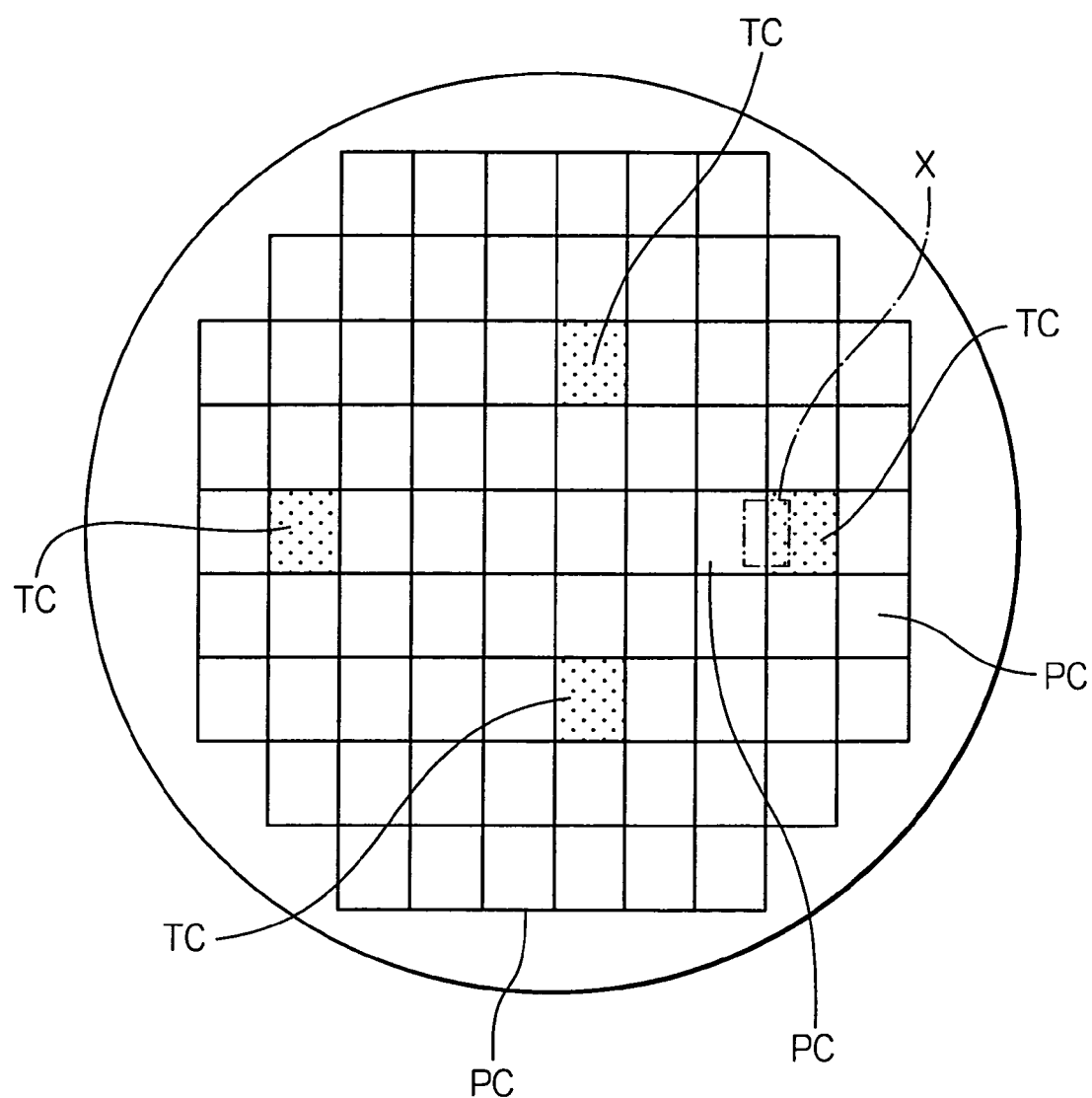
FIG. 1 is a plan view illustrating a first embodiment of the semiconductor wafer according to the present invention.

In FIG. 1, which illustrates a first embodiment of the semiconductor device (wafer) according to the present invention, a semiconductor wafer is divided into a plurality of product chips PC and a plurality of test chips TC. In this case, the number of the product chips PC is much larger than that of the test chips TC.

Figure 2:
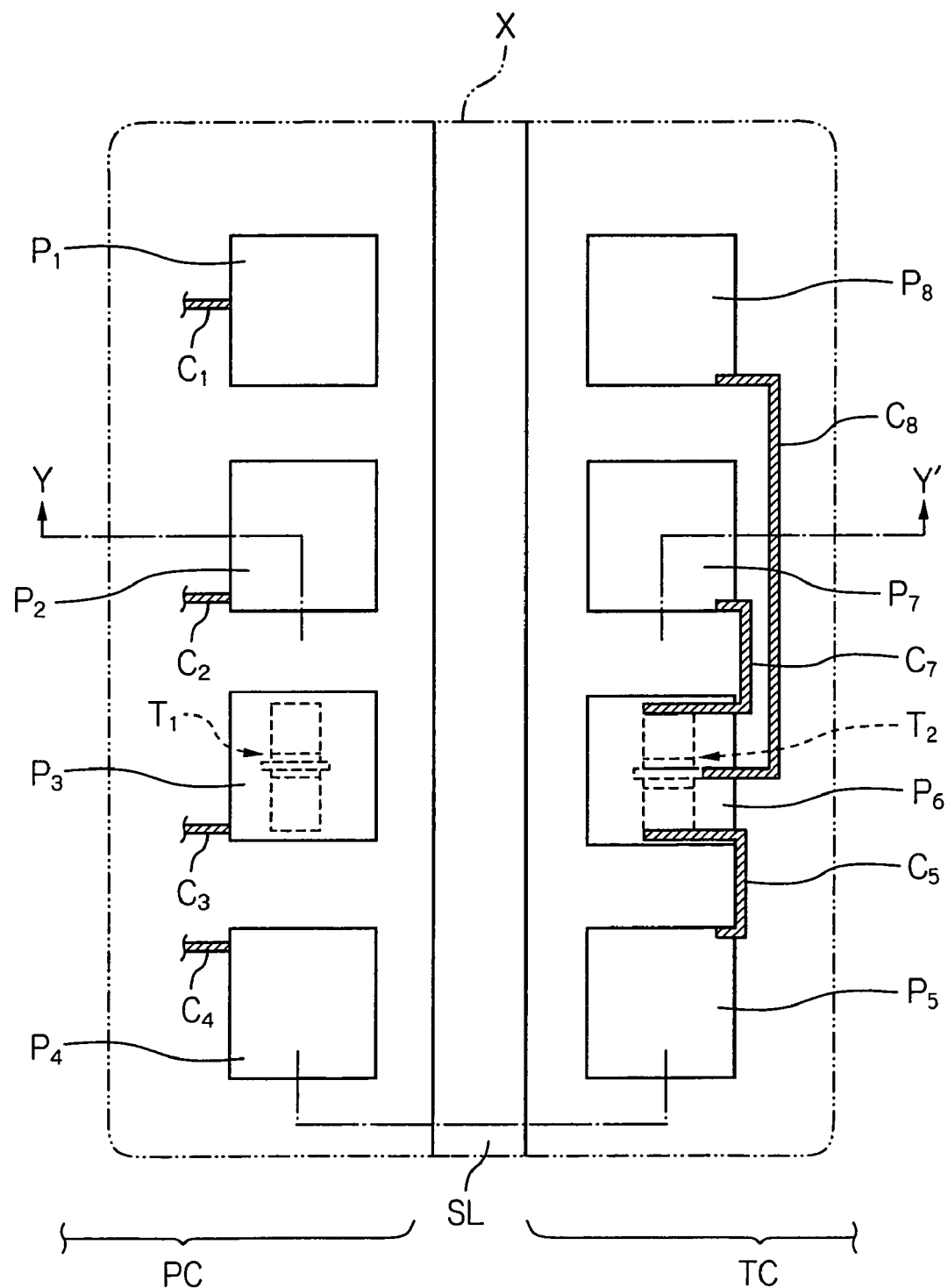
FIG. 2 is a partial enlargement as indicated by X in FIG. 1.

In FIG. 2, which is a partial enlargement as indicated by X in FIG. 1, the product chip PC and the test chip TC are separated by a scribe line area SL. Electrode pads $P_1, P_2, P_3$ and $P_4$ are provided on the periphery of the product chip PC, and electrode pads $P_5, P_6, P_7$ and $P_8$ are provided on the periphery of the test chip TC.

Also, in the product chip PC, a TEG element $T_1$ is formed completely beneath one of the electrode pads such as $P_3$. Similarly, in the test chip TC, a TEG element $T_2$ is formed completely beneath one of the electrode pads such as $P_6$. Note that the arrangement of the TEG elements in the product chips PC is the same as that in the test chips TC, so that the manufacturing steps therefor can be simplified.

In the product chip PC, the TEG element $T_1$ is not electrically connected to any of the electrode pads $P_1, P_2, P_3$ and $P_4$. In other words, the TEG element $T_1$ is electrically isolated from the electrode pads $P_1, P_2, P_3$ and $P_4$. Note that the electrode pads $P_1, P_2, P_3$ and $P_4$ are electrically connected via connection lines $C_1, C_2, C_3$ and $C_4$ to circuit elements (shown not in FIG. 2, but shown in FIG. 3).

On the other hand, in the test chip TC, the TEG element $T_2$ is electrically connected to some of the electrode pads $P_5, P_6, P_7$ and $P_8$. For example, note that the electrode pads $P_5, P_7$ and $P_8$ are electrically connected via connection lines $C_5, C_7$ and $C_8$ to circuit elements (shown not in FIG. 2, but shown in FIG. 3).

Figure 3:
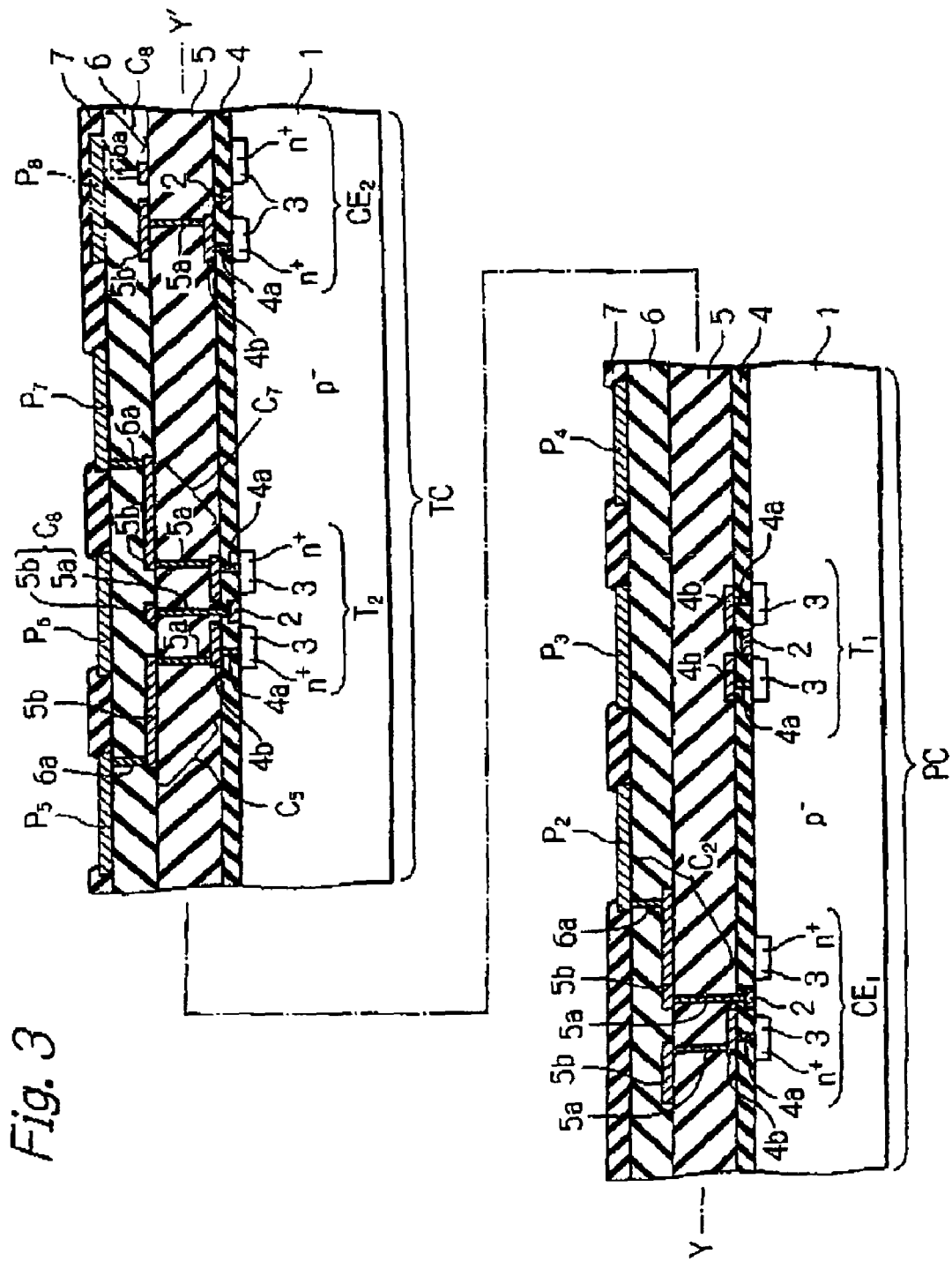
FIG. 3 is a cross-sectional view taken along the line Y-Y in FIG. 2.

In FIG. 3, which is a cross-sectional view taken along the line Y-Y' in FIG. 2, reference numeral 1 designates a $p^-$-type monocrystalline silicon substrate on which gate electrodes 2 made of polycrystalline silicon or the like are formed via a gate insulating layer (not shown). Also, $n^+$-type impurity diffusion regions 3 are formed in self-alignment with the gate electrodes 2. As a result, in the product chip PC, a circuit element $CE_1$ is formed by one MOS transistor and a TEG element $T_1$ is formed by one MOS transistor. Similarly, a TEG element $T_2$ is formed by one MOS transistor and a circuit element $CE_2$ is formed by one MOS transistor.

Also, an insulating layer 4 is formed where contact structures 4a are formed and reach the impurity regions 3. Connection layers 4b are formed on the contact structures 4a.

Further, an insulating layer 5 is formed where through structures 5a are formed and reach the gate electrodes 2 and the connection layers 4b. Connection layers 5b are formed on the through structures 5a.

Additionally, an insulating layer 6 is formed where through structures 6a are formed and reach the connection layers 5b. Electrode pads $P_1, P_2, \ldots, P_8$ are formed on the through structures 6a and the insulating layer 6.

Finally, a passivation layer 7 is formed and perforated to expose the electrode pads $P_1, P_2, \ldots, P_8$, thus completing the semiconductor wafer of FIG. 1.

In FIG. 3, the electrode pad $P_2$ is connected via a connection line $C_2$ formed by the through structure 6a, the connection layer 5b and the through structure 5a to the gate electrode 2 of the circuit element $CE_1$. The electrode pad $P_3$ is connected via a connection line $C_3$ (not shown) to a circuit element (not shown). The electrode pad $P_4$ is connected via a connection line $C_4$ (not shown) to a circuit element (not shown). The electrode pad $P_5$ is connected via a connection line $C_5$ formed by the through structure 6a, the connection layer 5b, the through structure 5a, the connection layer 4b and the contact structure 4a to the impurity region 3 of the TEG element $T_2$. The electrode pad $P_6$ is not electrically connected to any element. The electrode pad $P_7$ is connected via a connection line $C_7$ formed by the through structure 6a, the connection layer 5b, the through structure 5a, the connection layer 4b and the contact structure 4a to the impurity region 3 of the TEG element $T_2$. The electrode pad $P_8$ is connected via a connection line $C_8$ formed by the through structure 6a, the connection layer 5b, the through structure 5a, the connection layer 4b and the contact structure 4a to the gate electrode 2 of the TEG element $T_2$.

A method for manufacturing the semiconductor wafer of FIGS. 1, 2 and 3 will be explained next in detail with reference to FIGS. 4A, 4B and 4C as well as FIG. 3.

First, referring to FIG. 4A, a p$^-$-type monocrystalline silicon substrate 1 is thermally oxidized to form a gate insulating layer (not shown) made of silicon dioxide. Then, gate electrode layer made of polycrystalline silicon or the like is deposited on the gate insulating layer, and is patterned by a photolithography and etching process to form gate electrodes 2. Then, n-type impurities are implanted and diffused into the silicon substrate 1 in self-alignment with the gate electrodes 2 to form n$^+$-type impurity diffusion regions 3 which serve as source and drain regions of MOS transistors. Then, an insulating layer is deposited on the entire surface, and contact holes are perforated therein. Then, contact structures 4a are buried in the contact holes. Then, a conductive layer is deposited on the entire surface and is patterned by a photolithography and etching process to form connection layers 4b on the contact structures 4a.

Figure 4B:
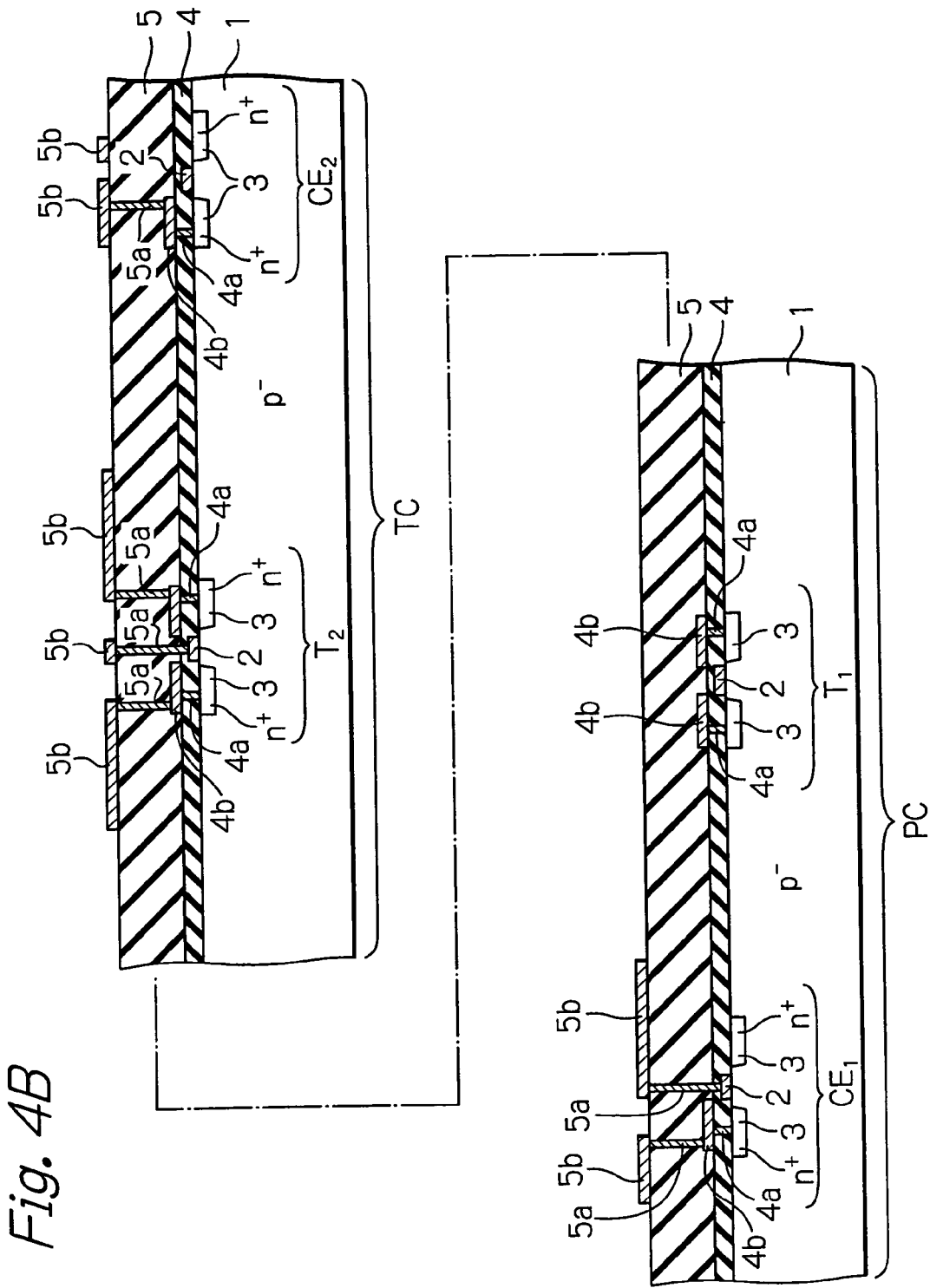

Next, referring to FIG. 4B, an insulating layer 5 is deposited on the entire surface, and throughholes are perforated therein. Then, through structures 5a are buried in the throughholes. Then, a conductive layer is deposited on the entire surface, and is patterned by a photolithography and etching process to form connection layers 5b on the through structures 5a.

Figure 4C:
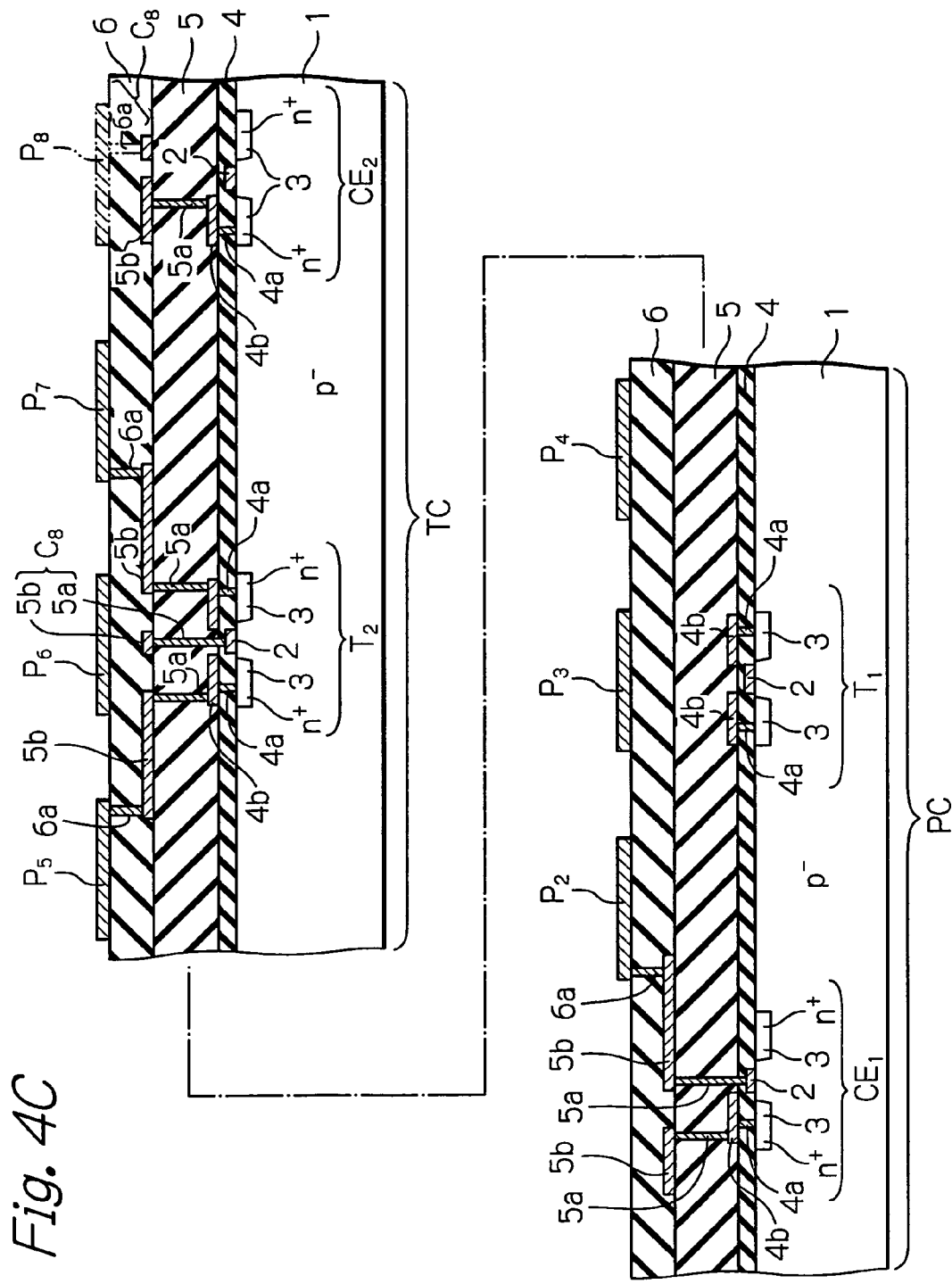

Next, referring to FIG. 4C, an insulating layer 6 is deposited on the entire surface, and throughholes are perforated therein. Then, through structures 6a are buried in the throughholes. Then, a conductive layer is deposited on the entire surface and is patterned by a photolithography and etching process to form electrode pads $P_1, P_2, \ldots, P_8$ on the through structures 6a.

Next, referring to FIG. 3, a passivation layer 7 is deposited on the entire surface, and is perforated to expose the electrode pads $P_1, P_2, \ldots, P_8$.

Finally, the product chips PC and the test chips TC are diced and assembled into chip packages where wires are bonded between the electrode pads $P_1, P_2, \ldots, P_8$ and external leads of the packages.

Figure 5:
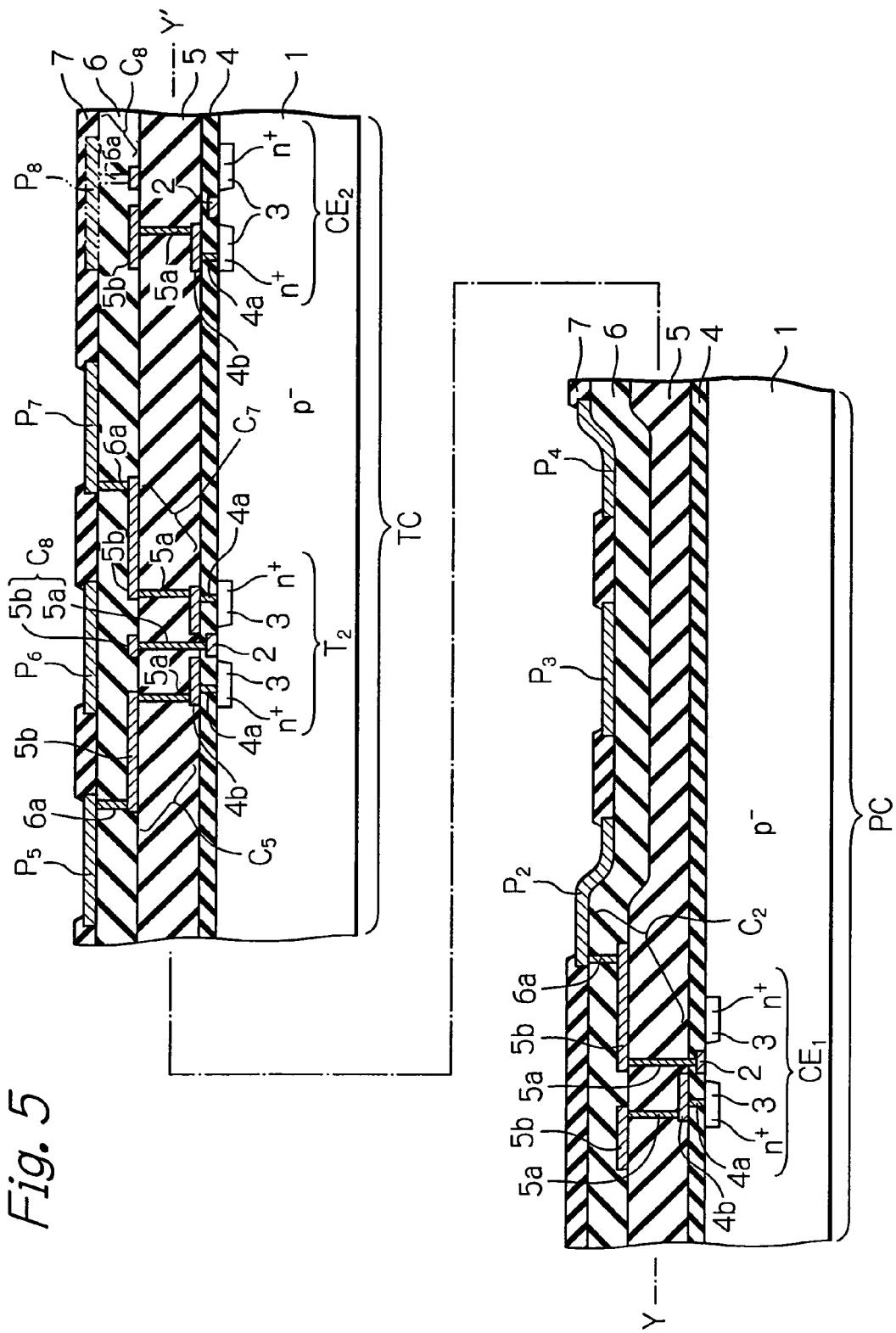
FIG. 5 is a cross-sectional view of FIG. 3 where no test element is provided in the product chip area.

In FIGS. 3, 4A, 4B and 4C, the contact structures 4a and the connection layers 4b are provided for the TEG element $T_1$ of the product chip PC and the TEG element $T_2$ of the test chip TC. On the other hand, the through structures 5a, the connection layers 5b and the through structures 6a are not provided for the TEG element $T_1$ of the product chip PC, while the through structures 5a, the connection layers 5b and the through structures 6a are provided for the TEG element $T_2$ of the test chip TC. As a result, the TEG element $T_1$ of the product chip PC$^+$ is electrically isolated from the electrode pads thereof. On the other hand, the TEG element $T_2$ of the test chip TC is electrically connected to some of the electrode pads thereof. Also, the manufacturer per se can evaluate the semiconductor wafer by testing the TEG element $T_2$ of the test chip TC, while a third party including users cannot evaluate the semiconductor device (in this case, the product chip PC) due to the electrical isolation of the TEG element $T_1$ and the electrode pads. In this case, since the test element $T_1$ is covered by the electrode pad, the third party cannot find the TEG element $T_1$ of the product chip PC. Also, since the TEG element $T_1$ is provided beneath the electrode pad $P_3$, which does not require additional occupied areas, the integration of the product chip PC is not affected. Further, since the TEG element $T_1$ can be formed by the manufacturing steps for the other portions of the product chip PC except for the through structures 5a, the connection layers 5b and the through structures 6a, the manufacturing cost hardly increases. Still further, since the structure of the product chips can be the same as that of the test chips except for the electrical connection/disconnection between the TEG element $T_1$ and the electrode pads, the manufacturing steps would not be complex, which would not increase the manufacturing cost and also the properties of the product chip PC would not deteriorate. For example, as illustrated in FIG. 5, if the TEG element $T_1$ is not provided in the product chip PC, the flattability characteristics of the insulating layers 5 and 6 deteriorate due to the CMP process, the etching process and the like, so that the properties of the product chip PC would deteriorate.

Figure 6:
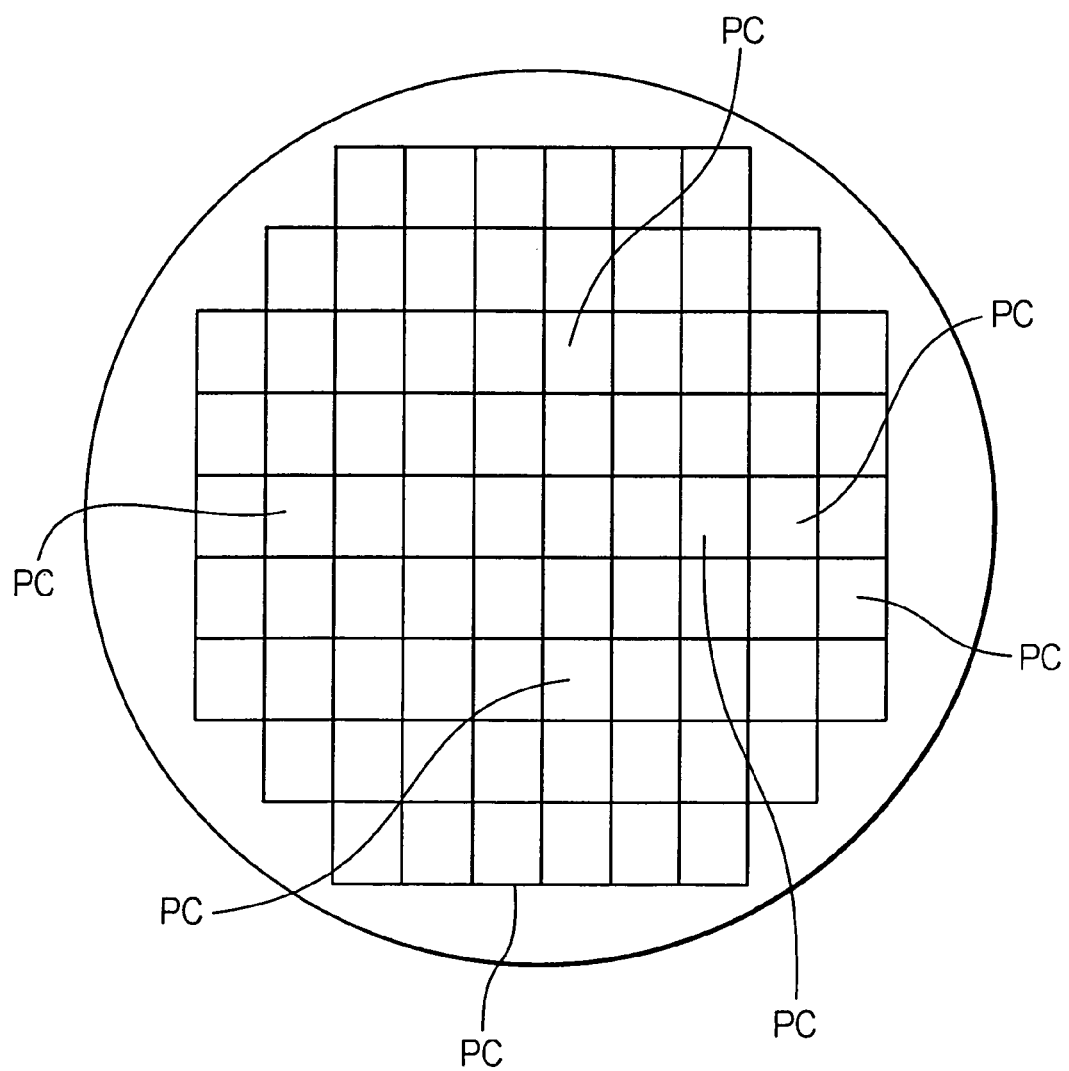
FIG. 6 is a plan view illustrating a second embodiment of the semiconductor wafer according to the present invention.

In FIG. 6, which illustrates a second embodiment of the semiconductor device (wafer) according to the present invention, a semiconductor wafer is divided into a plurality of product chips PC with no test chip. Each of the product chips PC is the same as those of FIG. 1.

Figure 7:
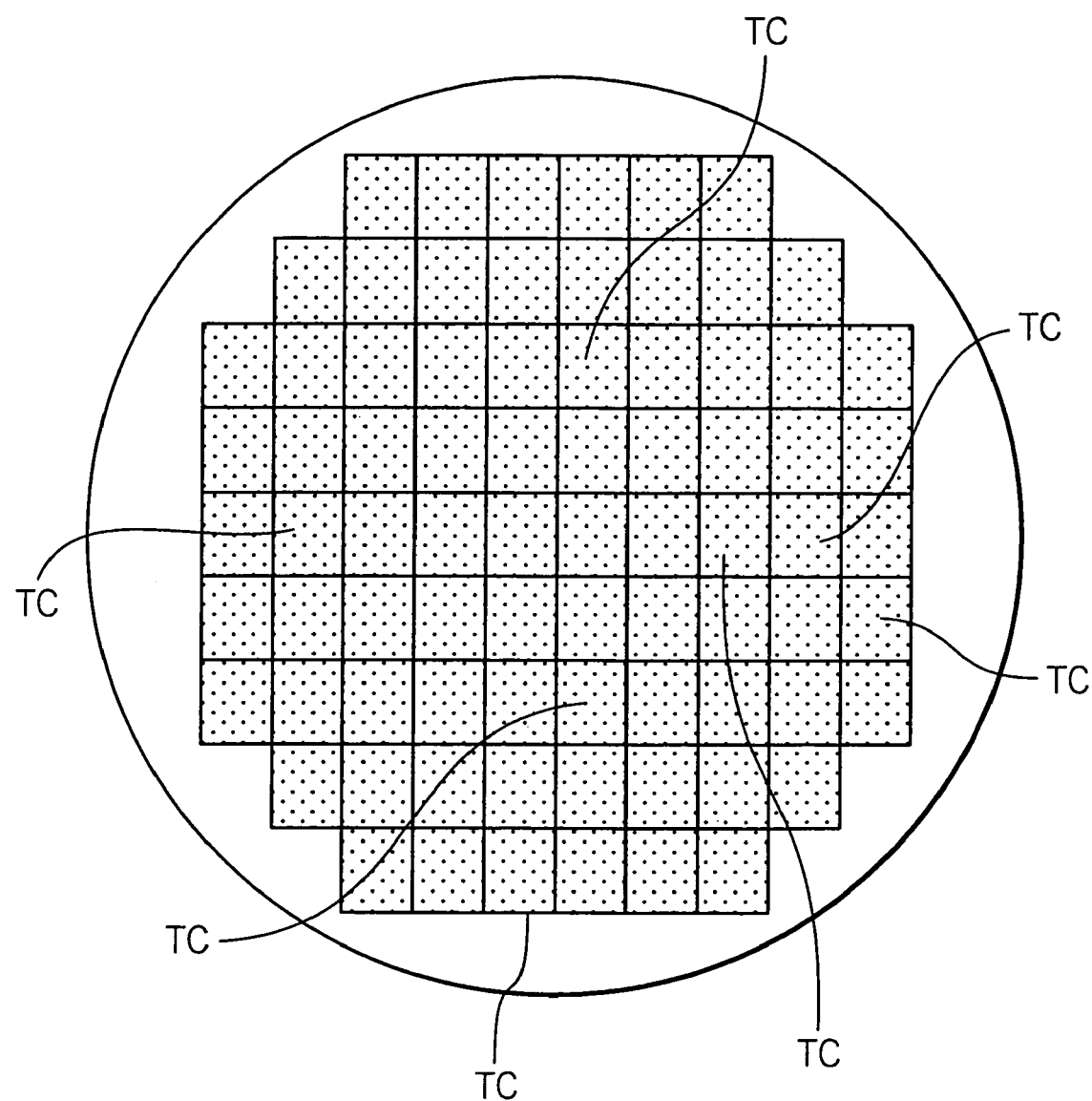
FIG. 7 is a plan view illustrating a third embodiment of the semiconductor wafer according to the present invention.

In FIG. 7, which illustrates a third embodiment of the semiconductor device (wafer) according to the present invention, a semiconductor wafer is divided into a plurality of test chips TC with no product chip. Each of the test chips TC is the same as those of FIG. 1.

Note that, in an actual wafer manufacturing process, one or more lots each formed by a plurality of semiconductor wafers are processed by a batch process. Therefore, if each lot is formed by a plurality of semiconductor wafers as illustrated in FIG. 6 and one semiconductor wafer as illustrated in FIG. 7, the properties of the product chips PC of the semiconductor wafers as illustrated in FIG. 6 would not deteriorate due to the absence of test chips TC, while the properties of the product chips PC of the semiconductor wafers of FIG. 6 can be evaluated by testing the test chips TC of the semiconductor wafer of FIG. 7.

Figure 8:
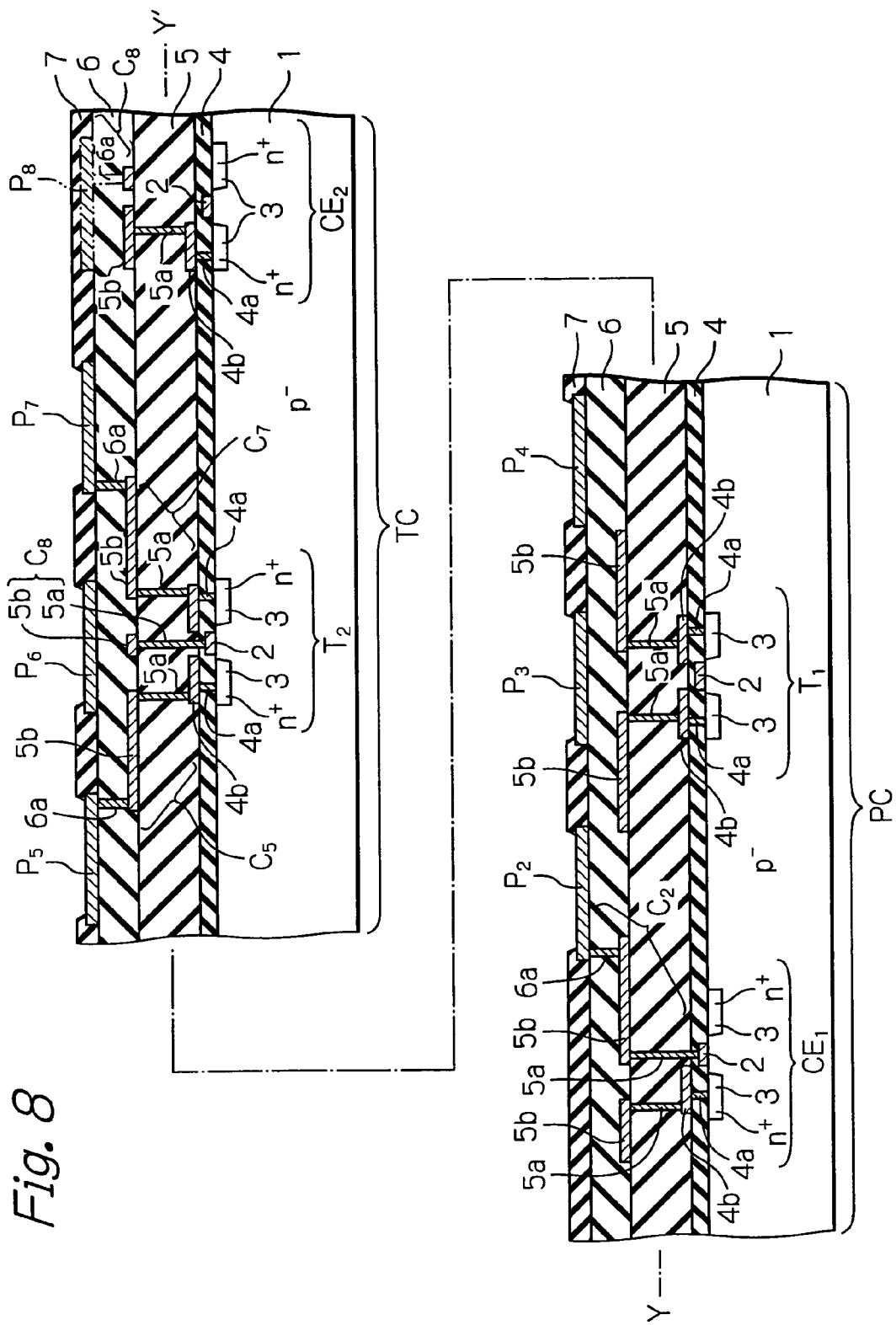
FIG. 8 is a cross-sectional view illustrating a modification of FIG. 3.

In the above-described embodiments, although the through structures 5a and the connection layers 5b are not provided for the TEG element $T_1$ of the product chip PC, the through structures 5a and the connection layers 5b can be provided for the TEG element $T_1$ of the product chip PC as illustrated in FIG. 8, thus further improving the flattability characteristics of the semiconductor wafer.

Figure 9:
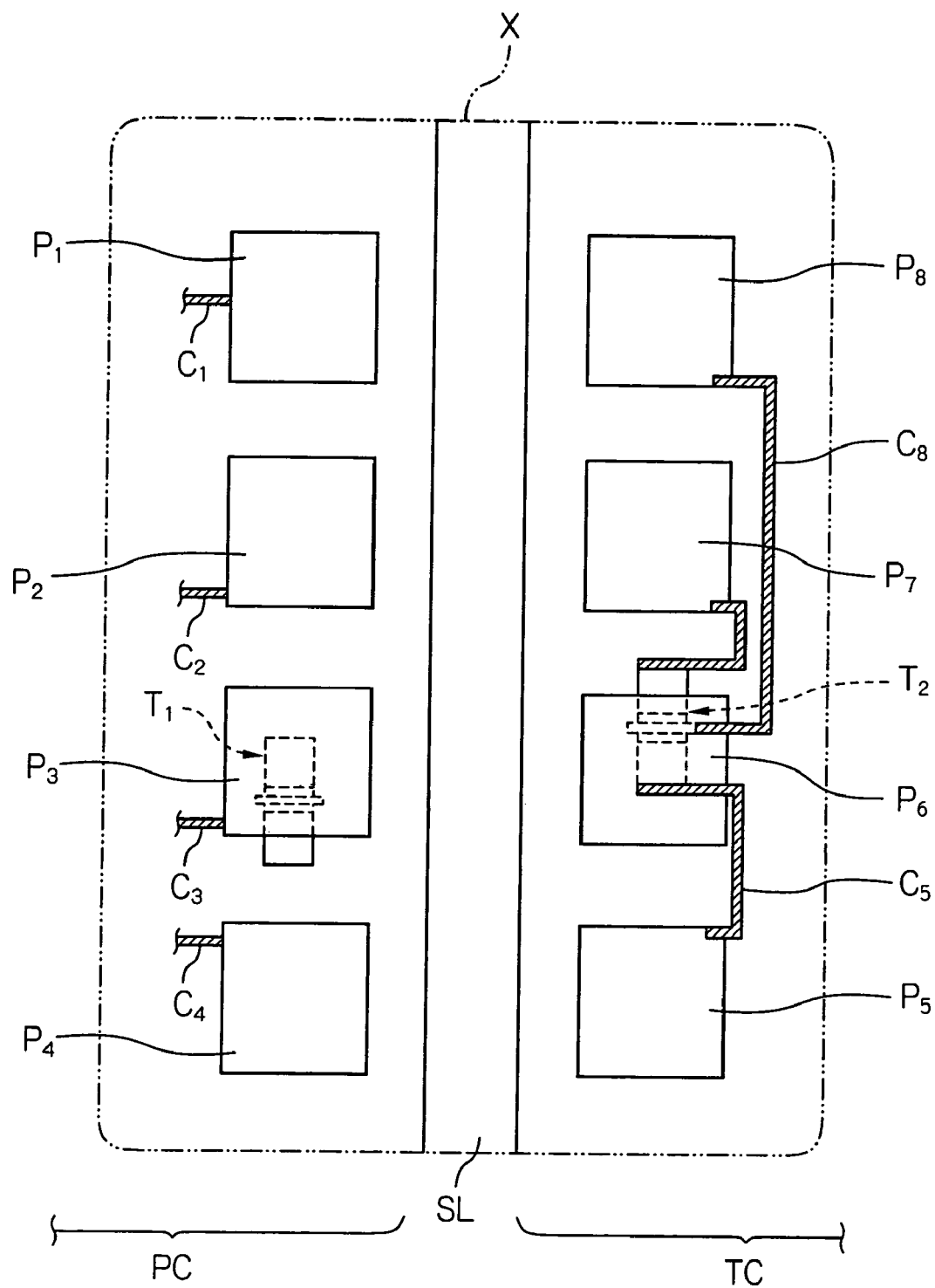
FIGS. 9, 10, 11, 12 and 13 are plan views illustrating modifications of FIG. 2.
Figure 10:
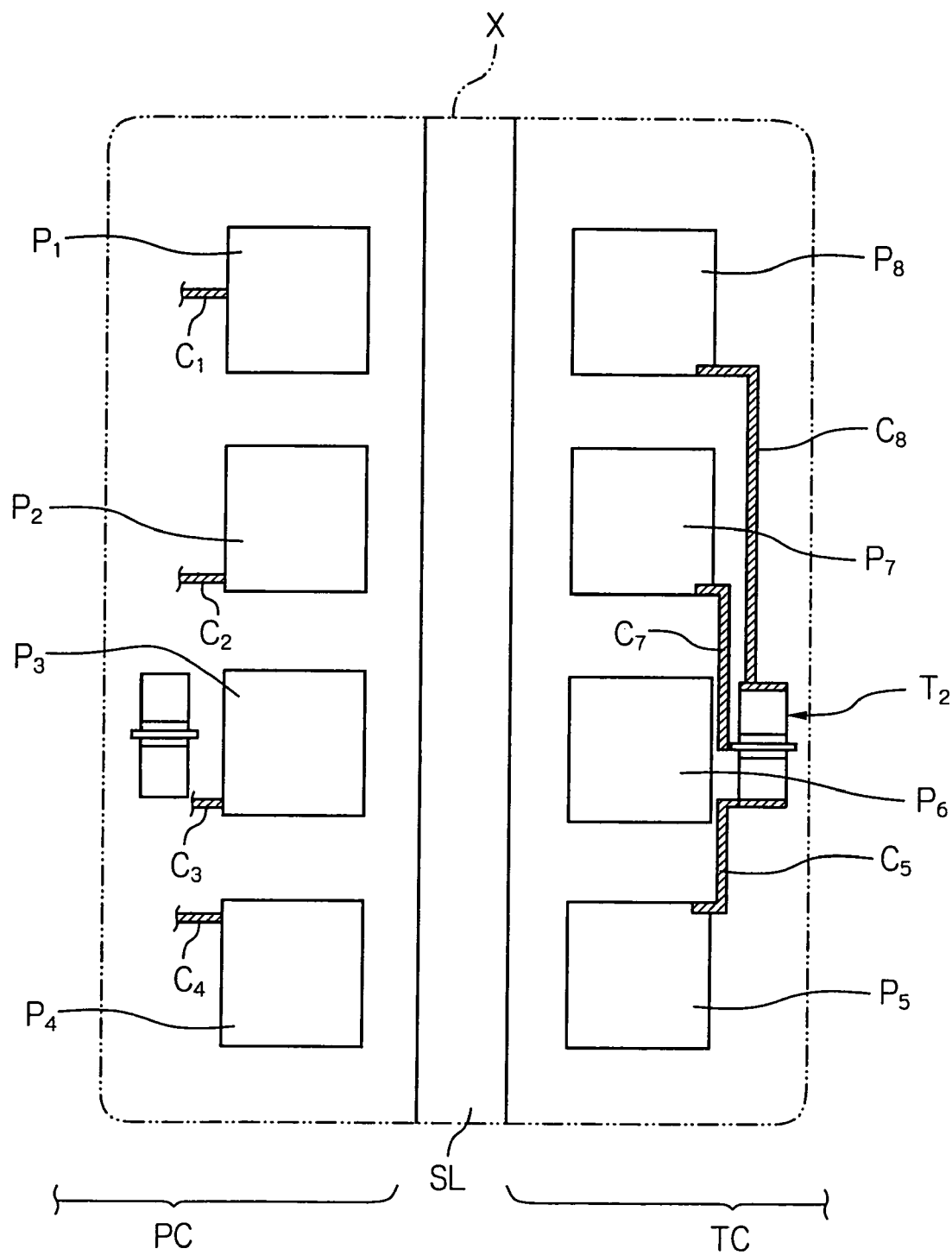

In the above-described embodiments, although the TEG elements $T_1$ and $T_2$ are formed completely beneath the electrode pads $P_3$ and $P_6$, respectively, the TEG elements $T_1$ and $T_2$ can be formed partly beneath the electrode pads $P_3$ and $P_6$, respectively, as illustrated in FIG. 9. Even in this case, a third party including users can hardly find the TEG elements $T_1$ and $T_2$ due to the presence of the insulating layers 5 and 6. Also, if there is a space around the electrode pads, the TEG elements $T_1$ and $T_2$ can be provided in the periphery of the electrode pads $T_3$ and $T_6$ as illustrated in FIG. 10. Even in this case, a third party including users can hardly find the TEG elements $T_1$ and $T_2$ due to the presence of the insulating layers 5 and 6.

Figure 11:
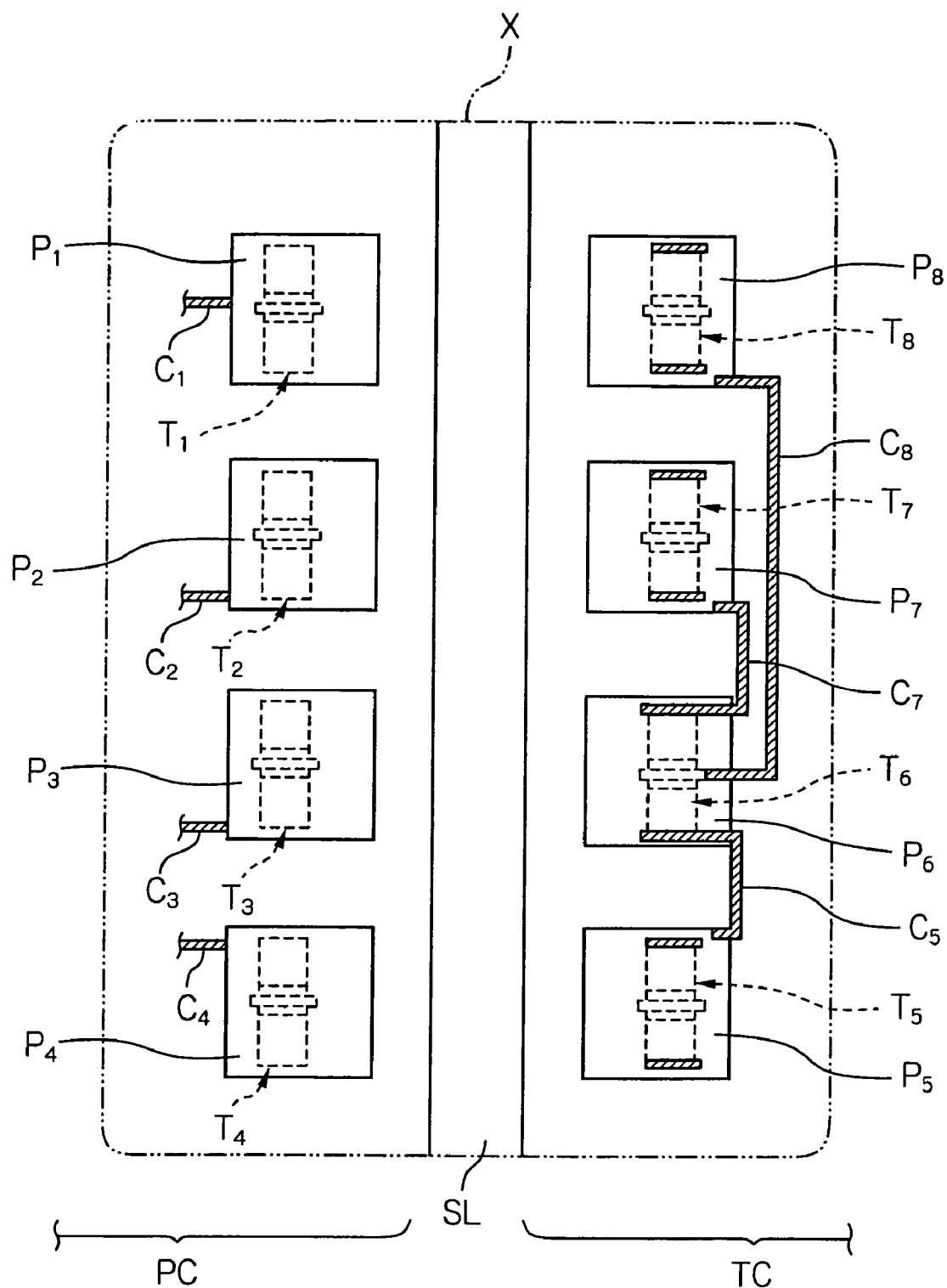
Figure 12:
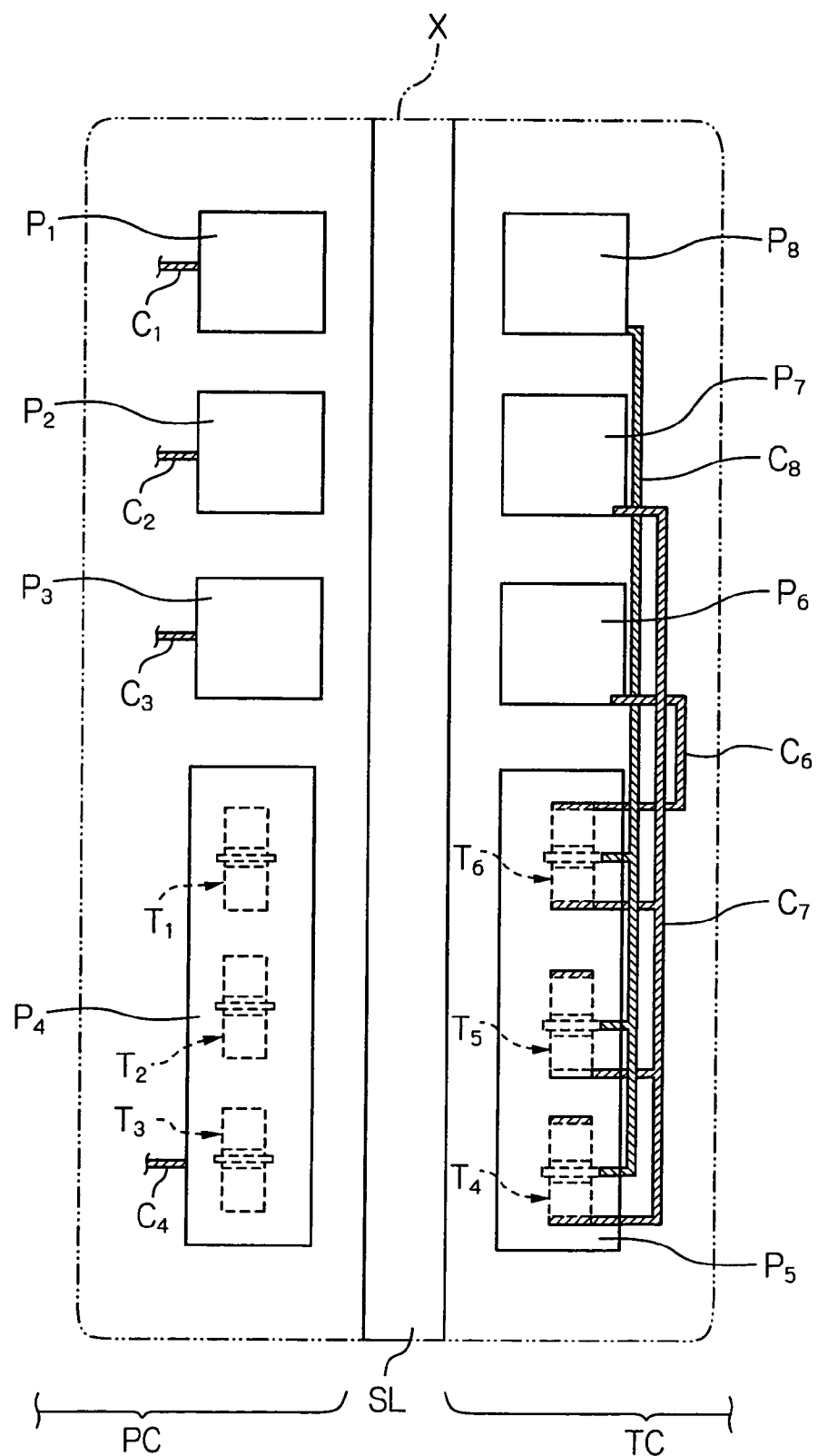

In the above-described embodiments, although only one TEG element is provided in each of the chips, a plurality of TEG elements each for one of the electrode pads can be provided as illustrated in FIG. 11. Note that the connection lines for the TEG elements $T_5$, $T_7$ and $T_8$ are omitted to simplify the description. In this case, the size of the source/drain regions, the gate width and the gate length of one TEG element are different from those of the other TEG elements, thus carrying out various kinds of test operations. Also, as illustrated in FIG. 12, if there is a large-sized electrode pad such as $P_4$ or $P_5$ where a plurality of TEG elements can be formed, a plurality of TEG elements such as $T_1$, $T_2$ and $T_3$ and $T_4$, $T_5$ and $T_6$ are formed beneath the electrode pads $P_4$ and $P_5$. Note that, in the TEG elements $T_4$, $T_5$ and $T_6$ of FIG. 12, the gates are connected by a connection line $C_8$ to the electrode pad $P_8$, and the sources are connected by a connection line $C_7$ to the electrode pad $P_7$. Also, in the TEG element $T_6$, the drain is connected via connection line $C_6$ to the electrode $P_6$. The drains of the TEG elements $T_4$ and $T_5$ are connected by connection lines to the other electrode pads; however, such connection lines are omitted to simplify the description. Even in this case, the size of the source/drain regions, the gate width and the gate length of one TEG element are different from those of the other TEG elements, thus carrying out various kinds of test operations.

Figure 13:
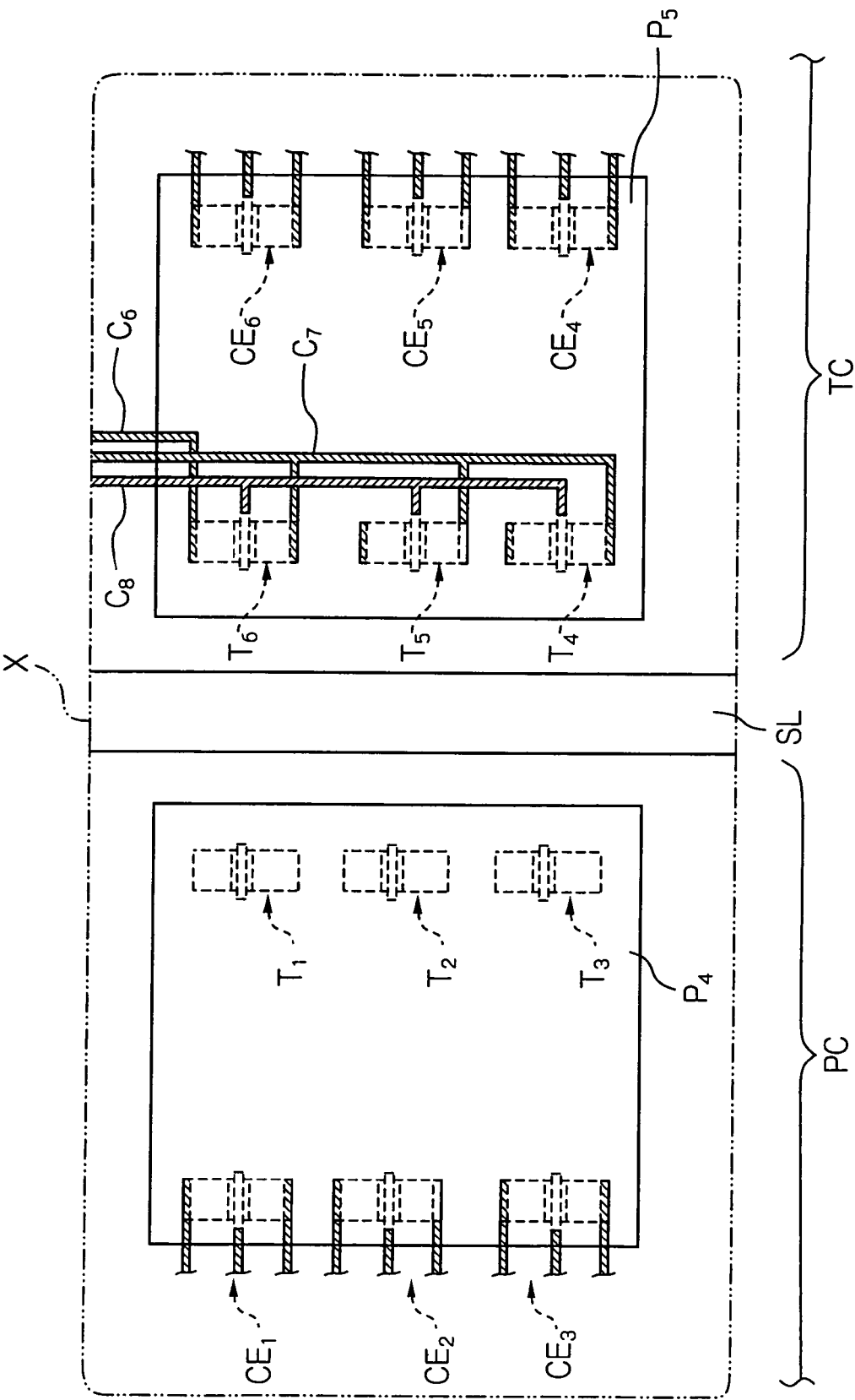

Further, when the fine structure of elements has been developed while the accuracy of manufacturing equipment such as bonding equipment has been not so improved, electrode pads may be much larger than circuit elements including TEG elements as shown in FIG. 13, where the electrode pads $P_4$ and $P_5$ of FIG. 12 are much larger. In this case, circuit elements $CE_1$, $CE_2$ and $CE_3$ as well as the TEG elements $T_1$, $T_2$ and $T_3$ are provided beneath the electrode pad $P_4$ and circuit elements $CE_4$, $CE_5$ and $CE_6$ are provided beneath the electrode pad $P_5$.

Figure 14A:
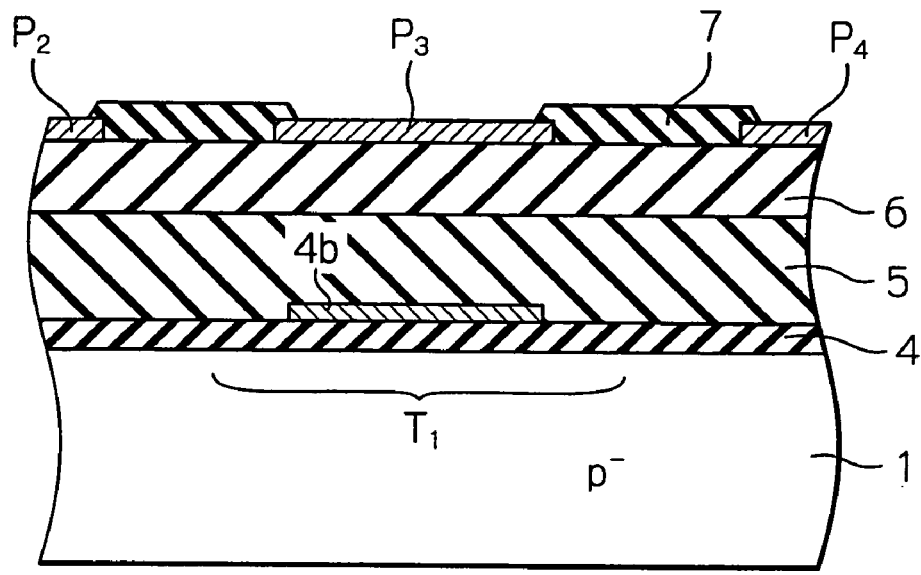
FIGS. 14A and 14B are cross-sectional views of modifications of the test elements of FIG. 3 where resistance elements are provided as such test elements.
Figure 14B:
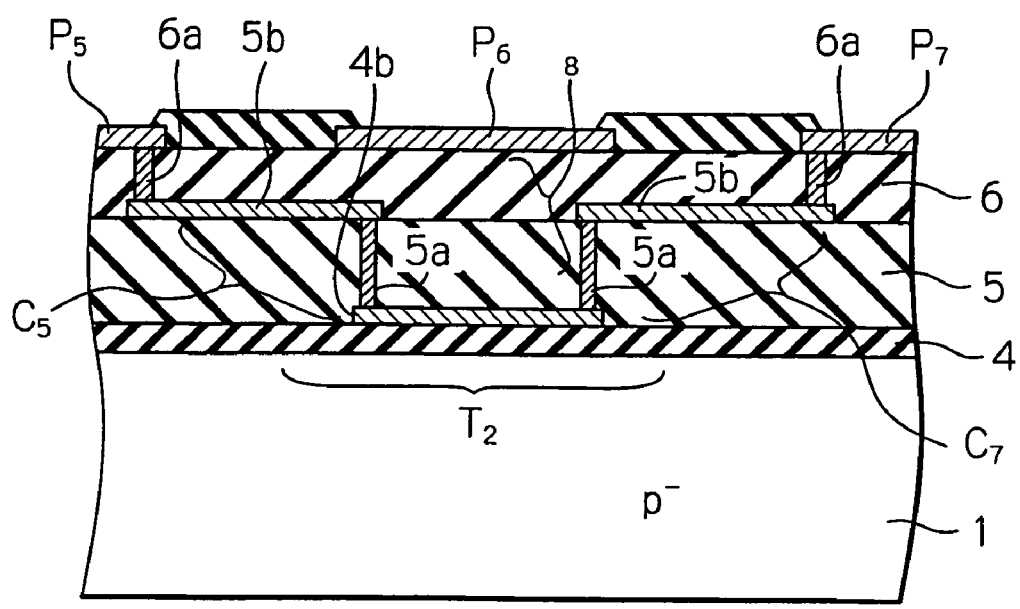
Figure 15A:
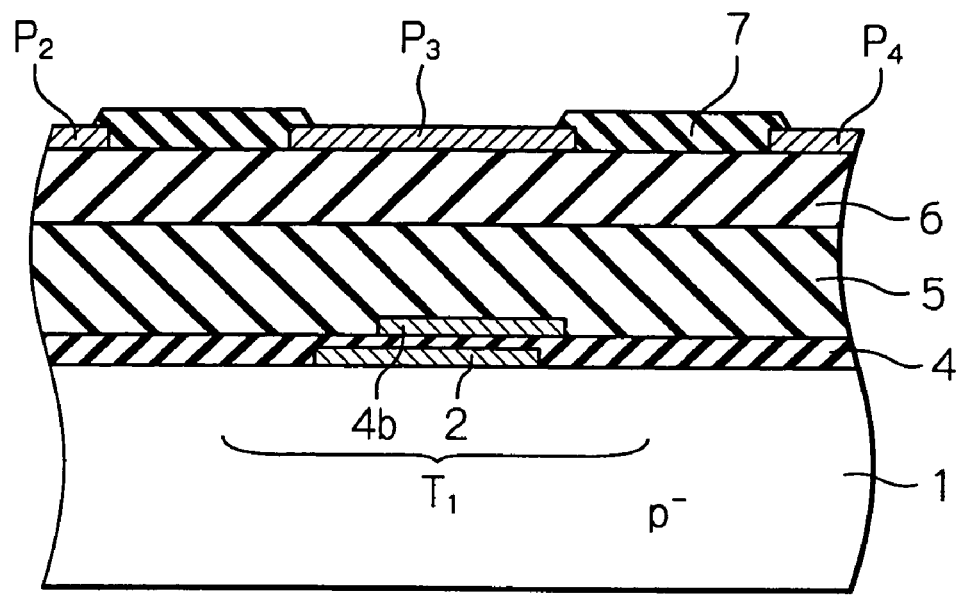
FIGS. 15A and 15B are cross-sectional views of modifications of the test elements of FIG. 3 where capacitance elements are provided as such test elements.
Figure 15B:
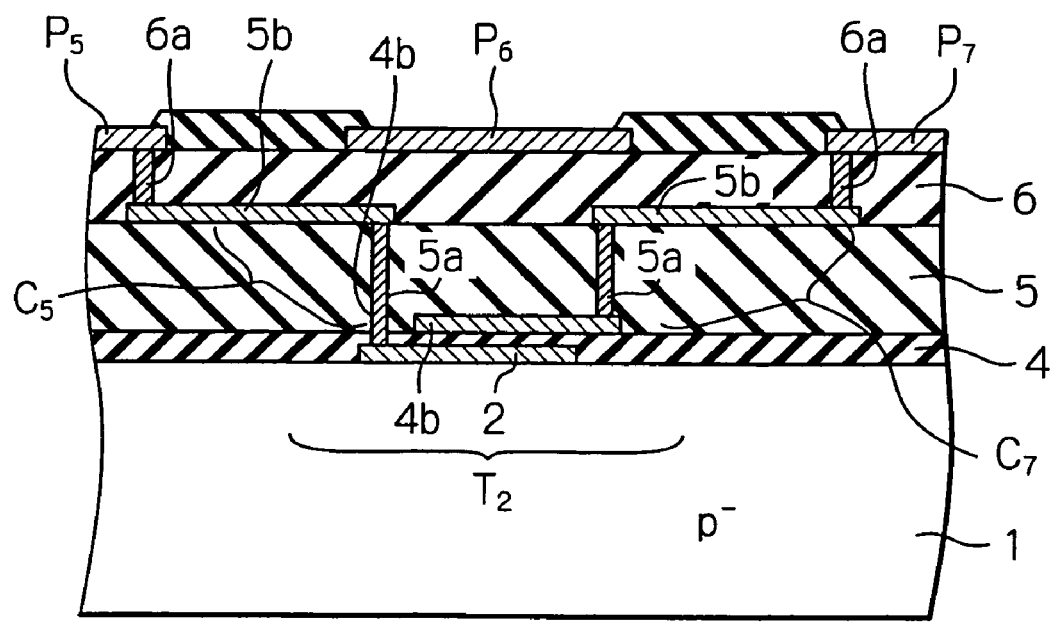

Additionally, in the above-described embodiments, the TEG elements can be formed of other active elements such as bipolar transistors, or passive elements such as resistance elements or capacitance elements. For example, as illustrated in FIGS. 14A and 14B, the TEG elements $T_1$ and $T_2$ are constructed by resistance elements formed by the connection layers 4b. On the other hand, as illustrated in FIGS. 15A and 15B, the TEG elements $T_1$ and $T_2$ are constructed by capacitance elements formed by the layers 2 and 4b and the insulating layers 4 therebetween.

The invention claimed is:

1. A semiconductor device, comprising:
   a semiconductor substrate;
   an electrode pad of a plurality of electrode pads formed over said semiconductor substrate;
   at least one test element formed in a region of said semiconductor substrate beneath said electrode pad, said test element being electrically isolated from any of the electrode pads that are disposed outside of said region, and from said electrode pad; and
   at least another test element formed beneath another electrode pad of the plurality of electrode pads in said semiconductor substrate,
   wherein said another electrode pad is electrically isolated from any element in said semiconductor device.

2. The semiconductor device as set forth in claim 1, wherein said semiconductor device further comprises at least one circuit element formed in said region, and
   wherein said at least one circuit element is electrically connected to a group of said electrode pads disposed outside of said region, and to said electrode pad.

3. The semiconductor device as set forth in claim 1, wherein said test element is arranged completely beneath said electrode pad.

4. The semiconductor device as set forth in claim 1, wherein said test element is arranged partly beneath said electrode pad.

5. The semiconductor device as set forth in claim 1, wherein said test element is arranged in a periphery of said electrode pad.

6. The semiconductor device as set forth in claim 1, wherein said test element comprises one of a transistor element, a resistance element and a capacitance element.

7. A semiconductor device, comprising:
   a semiconductor substrate;
   an electrode pad of a plurality of electrode pads formed over said semiconductor substrate;
   at least one test element formed in a region of said semiconductor substrate beneath said electrode pad;
   at least one circuit element formed in said region, and
   at least another test element formed beneath another electrode pad of the electrode pads in said semiconductor substrate,
   wherein said at least one test element is electrically isolated from any of the electrode pads that are disposed outside of said region, and from said electrode pad,
   wherein said at least one circuit element is electrically connected to a group of said electrode pads that is disposed outside of said region, and
   wherein said another electrode pad is electrically isolated from any element in said semiconductor device.

8. The semiconductor device as set forth in claim 1,
   wherein a group of said plurality of electrode pads is electrically connected to said at least one circuit element via a plurality of connection lines.

9. The semiconductor device as set forth in claim 1, wherein an area between said electrode pad and said test element comprises a plurality of insulating layers rather than a through structure.

10. The semiconductor device as set forth in claim 7,
    wherein said group of said plurality of electrode pads is electrically connected to said at least one circuit element via a plurality of connection lines.

* * * * *